United States Patent
Tsai

Patent Number: 5,831,307
Date of Patent: *Nov. 3, 1998

[54] SILICON DAMAGE FREE PROCESS FOR DOUBLE POLY EMITTER AND REVERSE MOS IN BICMOS APPLICATION

[75] Inventor: Nun-Sian Tsai, Hsinchu, Taiwan

[73] Assignee: Taiwan Semiconductor Manufacturing Company, Ltd., Hsin-Chu, Taiwan

[ * ] Notice: This patent issued on a continued prosecution application filed under 37 CFR 1.53(d), and is subject to the twenty year patent term provisions of 35 U.S.C. 154(a)(2).

[21] Appl. No.: 802,178

[22] Filed: Feb. 15, 1997

Related U.S. Application Data

[60] Continuation of Ser. No. 518,703, Aug. 24, 1995, abandoned, which is a division of Ser. No. 108,225, Aug. 19, 1993, Pat. No. 5,466,615.

[51] Int. Cl.⁶ .......................... H01L 29/76; H01L 29/94; H01L 31/062; H01L 31/113
[52] U.S. Cl. ................................ 257/346; 257/382
[58] Field of Search ..................... 257/346, 382, 257/565, 578, 584, 587, 583

[56] References Cited

U.S. PATENT DOCUMENTS

| | | | |
|---|---|---|---|
| 4,157,269 | 6/1979 | Ning et al. . | |
| 4,209,349 | 6/1980 | Ho et al. | 148/187 |
| 4,209,350 | 6/1980 | Ho et al. | 148/188 |
| 4,234,362 | 11/1980 | Riseman | 148/187 |
| 4,256,514 | 3/1981 | Pogge | 148/1.5 |
| 4,296,426 | 10/1981 | Gilles | 357/23 |
| 4,366,613 | 1/1983 | Ogura et al. | 29/571 |
| 4,378,627 | 4/1983 | Jambotkar | 29/571 |
| 4,419,810 | 12/1983 | Riseman | 29/571 |
| 4,546,535 | 10/1985 | Shepard | 29/571 |
| 5,121,184 | 6/1992 | Huang et al. . | |
| 5,137,840 | 8/1992 | Desilets et al. . | |
| 5,162,245 | 11/1992 | Farreau | 437/31 |

FOREIGN PATENT DOCUMENTS 1-11365  1/1989  Japan .

*Primary Examiner*—Stephen Meier
*Attorney, Agent, or Firm*—George O. Saile; Stephen B. Ackerman

[57] ABSTRACT

Self-aligned transistors, which may be either bipolar or field effect, are described. Three insulator layers are formed over the surface of a monocrystalline semiconductor substrate and are patterned to form a protective block over the location of the first element of the transistor. A doped conductive layer is formed upon the substrate and upon the protective block. A fourth insulator layer is formed on the doped conductive layer. Those portions of the doped conductive layer and the fourth insulator layer that are above the horizontal plane of the top of the third insulator layer are removed. The third insulator layer is removed from the protective block. The structure is heated to form the second and third elements by outdiffusion. Oxide spacers are formed adjacent to the protective block. The protective block is removed. A gate oxide is formed for a field effect transistor. A second conductive layer is formed and patterned on and above the fifth insulator layer, and the elements of the transistors are completed with electrical contacts to the elements of the transistors.

3 Claims, 4 Drawing Sheets

SILICON DAMAGE FREE PROCESS FOR DOUBLE POLY EMITTER AND REVERSE MOS IN BICMOS APPLICATION

This application is a continuation of Ser. No. 08/518,703, filed Aug. 24, 1997 abandoned, which divisional of application Ser. No. 08/108,225, filed Aug. 19, 1993 and now U.S. Pat. No. 5,466,615.

BACKGROUND OF THE INVENTION (1) Field of the Invention

This invention relates to semiconductor integrated circuit structures and to methods for manufacturing such integrated circuits wherein self-aligned transistor structures are formed.

(2) Description of the Prior Art

The self-aligned silicon gate field effect transistor process and resulting structure has been a standard in the industry for some time. The process involves growing an insulating layer over the semiconductor substrate and then forming a polysilicon layer thereover. Lithography and etching techniques are used to remove all of the polysilicon layer except in the areas where the field effect transistor gates are to be located in the integrated circuit structure. This resulting gate structure is now used as a mask for forming the source/drain of the transistor in what is termed a self-aligned structure.

Improvements have been made in the self-aligned processing and structures. These improvements are particularly important in the manufacture of submicron integrated circuits.

One such improvement field has been for methods to form narrow dimensioned, for example, submicron regions on a semiconductor body. Reference is made to the I. T. Ho et al U.S. Pat. Nos. 4,209,349 and 4,209,350, K. Riseman U.S. Pat. No. 4,234,362 and the H. B. Pogge U.S. Pat. No. 4,256,514 which describe the formation of such regions. These patents all involve the formation of substantially horizontal surfaces and substantially vertical surfaces on a silicon body and then forming a layer of a very narrow dimension on both the substantially horizontal and substantially vertical surfaces. This layer is then subjected to an anisotropic etching process such as by reactive ion etching, to substantially remove the horizontal layer, exposing the bare silicon substrate, while leaving the vertical layer substantially intact. The vertical layer dimension is adjusted depending upon the original thickness of the layer applied. In this way such a narrow dimension region of one micrometer or less is obtained.

Another improved self-aligned gate structure is the lightly doped drain or LDD. For example, where the LDD in an N channel MOS FET is included, in addition to the channel separating implanted N+ source and drain regions, there are submicron diffused N− regions. These N− regions increase the channel breakdown voltage and reduce drain junction electron impact ionization (and thus, hot electron emission) by spreading the high electric field at the drain pinch-off region into the N− region. One improved process for making such an LDD device is described in the S. Ogura et al U.S. Pat. No. 4,366,613 in which the N− region is first formed using the polysilicon gate as the mask, submicron sidewall spacers are formed on the sides of the polysilicon gate, and the N+ source/drain regions are formed by ion implantation using the gate and sidewall spacer structure as the mask which results in the N− LDD structure. Other lightly doped drain structures and methods are shown by the I. T. Ho et al U.S. Pat. Nos. 4,209,349 and 4,209,350.

The reverse self-aligned field effect transistor process has been suggested by a limited number of workers in the field. Reference is made to the U.S. Pat. Nos. 4,296,426 to Thomson C. S. F., 4,378,627 to C. G. Jambotkar, 4,419,810 to J. Riseman and 4,546,535 to Shepard. These patents generally describe the reverse process wherein a heavily doped conductive layer such as polycrystalline silicon or the like is formed upon a silicon substrate and an insulator layer formed thereover. This multilayer structure is etched through to the bare silicon substrate to result in a patterned conductive polycrystalline layer or the like with substantially vertical sidewalls. The pattern of the conductive layer is chosen to be located above the planned source/drain regions with openings in the pattern at the location of the field effect transistor's channel. A sidewall insulator spacer can now be formed on the vertical sidewalls as described, for example in the previous paragraphs. The sidewall layer may be doped with conductive imparting impurities. The gate dielectric is formed on the channel surface. The source/drain region and preferably lightly doped region are simultaneously formed by thermal drive-in from the conductive first polycrystalline silicon layer or the like and insulator sidewall layer respectively. The desired gate electrode is formed upon the gate dielectric and electrical connections made to the various elements of the field effect transistor devices.

The methods described above for forming the self-aligned devices can lead to damage in the critical area of the substrate surface above the device channel, due to the difficulty in preventing etching materials from attacking the bare substrate. In the anisotropic ion etch to form sidewall spacers, and in the etch of the heavily doped conductive layer in the reverse self-aligned techniques, it is a difficult control problem to stop the etch at the proper time without damaging the substrate. One solution to remedy this problem in the formation of bipolar transistors is shown in U.S. Pat. No. 5,162,245 by Favreau. However, the selective polysilicon growth technique taught by Favreau may not be completely selective, with the result that polysilicon or polysilicon residues form on top of oxide 18. This unwanted polysilicon can cause later problems of defects, electrical shorts, etc.

SUMMARY OF THE INVENTION

It is therefore an object of this invention to make improvements in the self-aligned process and resulting devices so as to prevent damage to the substrate.

It is a further object of the invention to make improvements in the self-aligned process that can be used for making both bipolar and field effect transistors.

It is a still further object of this invention to make improvements in the self-aligned process for making biCMOS integrated circuits.

In accordance with the present invention a method of forming self-aligned transistors which may be either bipolar or field effect is described. A first insulator layer is formed upon the surface of a monocrystalline semiconductor substrate. A second insulator layer is formed upon the surface of the first insulator layer. A third insulator layer is formed upon the surface of the second insulator layer. The first, second and third insulator layers are patterned to form a protective block over the location of the first element of the transistor, the emitter in the case of a bipolar transistor, and the gate area in the case of a field effect transistor. A heavily doped conductive layer of one conductivity type is formed upon the monocrystalline semiconductor substrate which has opposite conductivity type, and upon the protective block. A fourth insulator layer is formed on the heavily doped conductive layer. Those portions of the heavily doped conductive layer and the fourth insulator layer that are above the horizontal plane of the top of the third insulator layer are removed. The third insulator layer is removed from the protective block. The structure is heated to form the heavily doped portions of the base for a bipolar transistor, and the source/drain for a field effect transistor, by outdiffusing from the heavily doped conductive layer. The exposed portion of the heavily doped conductive layer is oxidized to form oxide spacers adjacent to the protective block. The remainder of the protective block is removed. A fifth insulator layer is formed over the location of the gate element when forming a field effect transistor. A second conductive layer is formed and patterned on and above the fifth insulator layer, and the elements of the transistors are completed with electrical contacts to the elements of the transistors.

A self-aligned transistor integrated circuit device structure is also envisioned by this invention. This structure includes a silicon semiconductor substrate having field isolation regions that isolate semiconductor surface regions from one another. There are heavily doped regions of one conductivity in at least some of the semiconductor surface regions which are of an opposite conductivity. Directly above the heavily doped regions are heavily doped conductive layers which are of the same conductivity, and are the source of the dopant in the heavily doped regions. On the inner periphery of the heavily doped conductive layers are oxide spacers. Means are provided for connecting the remaining elements of the transistors. Appropriate electrical contact means are made to the elements to form the completed integrated circuit structure. Both bipolar and field effect transistor device structures are envisioned.

DISCLOSURE OF THE INVENTION

Referring now more particularly to FIGS. 1 through 4 there is shown a self-aligned transistor in a high density integrated circuit structure. The process is illustrated to form an N channel MOSFET integrated circuit. However, it should be understood that a P channel field effect transistor can be formed by simply reversing the polarity of the various elements of the transistors and associated regions.

Figure 1:
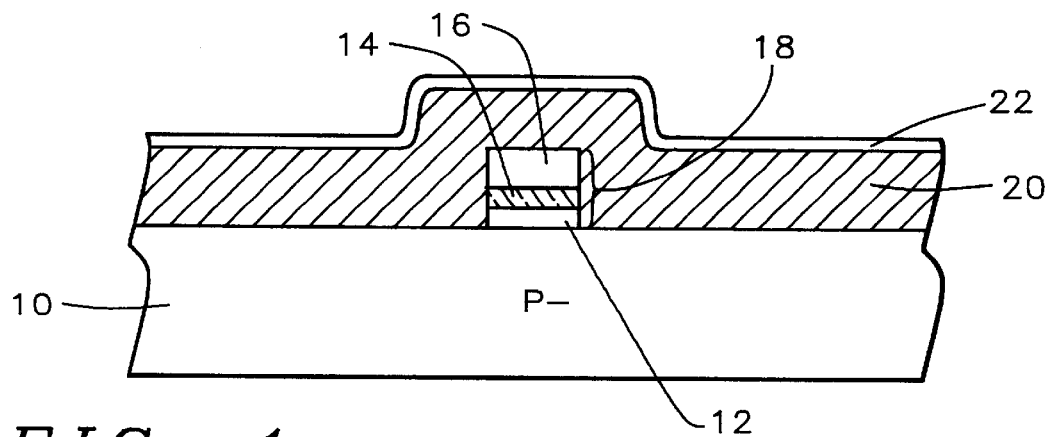
FIGS. 1 through 4 are a cross-sectional representation of a first embodiment method for an improved self-aligned process for a field effect transistor that prevents damage to the substrate.

The first series of steps involve the formation of a protective block to prevent damage to the gate area of substrate. The semiconductor substrate 10 may be composed of any of the various known semiconductor materials, but is preferably composed of silicon having a (100) crystallographic orientation. The substrate 10 in this example is doped P− as seen in FIG. 1.

A first layer 12 of silicon oxide is thermally grown by conventional means to a thickness of between about 250 and 350 Angstroms. A layer of silicon nitride 14 is then deposited by chemical vapor deposition to a thickness of between about 1000 and 1500 Angstroms. Another layer of silicon oxide 16 in the form of tetraethoxysilane (TEOS) is deposited by chemical vapor deposition to a thickness of between about 3500 and 4000 Angstroms. These three insulating layers are then patterned using conventional lithography and etching to form the O—N—O (oxide-nitride-oxide) protective block 18, as shown in FIG. 1.

A conformal layer of polycrystalline silicon 20 is now deposited over the substrate 10 and protective block 18. Polysilicon 20 is then ion implanted with phosphorus for this embodiment in which an N-channel FET device is to be formed. If a P-channel FET is desired, then the ion implant would be with a suitable P dopant such as boron or boron fluoride ($BF_2$). The thickness of the polysilicon layer is between about 4500 and 5500 Angstroms. A silicon nitride layer 22 is now deposited by chemical vapor deposition to a thickness of between about 1000 and 2000 Angstroms.

Figure 2:
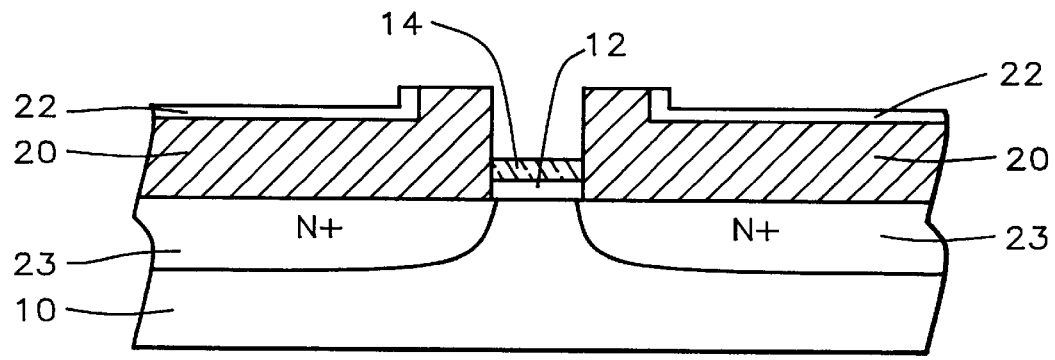
Figure 3:
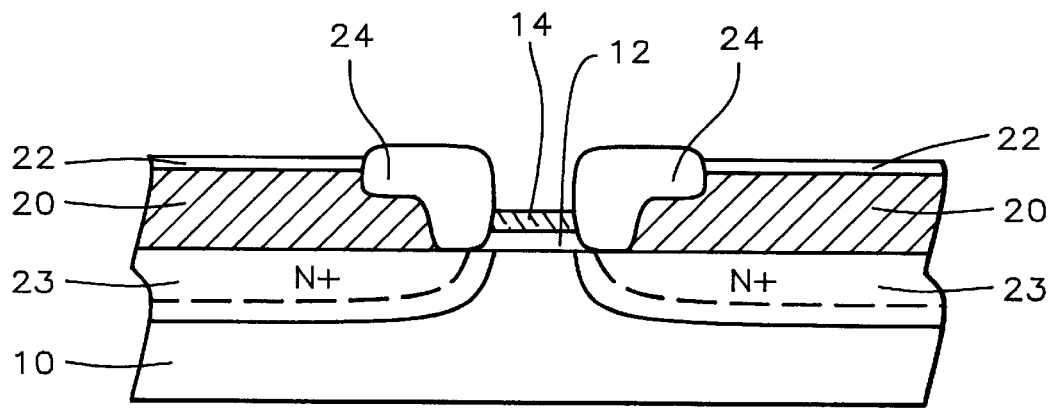

Referring now more particularly to FIG. 2, the layers 20 and 22 are etched by a photoresist planarization and etchback process to expose oxide 16 (shown removed). The etching technique used is either a reactive ion etch using chemistry such as $CF_4, C_2F_6, O_2$, as the fluoride gives a high etch rate for polysilicon, and the oxygen a high etch rate for photoresist, or chemical mechanical polishing. It can be seen in FIG. 2 that a portion of polysilicon 20 is now exposed in the area between protective block 18 and silicon nitride 22. Oxide 16 is removed by a wet etch using HF at a 10:1 ratio at a temperature of about 25° C. The N+ source/drain regions 23 are now formed by annealing the FIG. 2 structure at between about 900° and 950° C. until the N+/P junction is about 0.2 to 0.3 micrometers below the surface. Annealing is done in a 5% oxygen plus nitrogen atmosphere for between about 30 and 40 minutes. Referring now to FIG. 3, silicon nitride layer 22 is used as a mask during oxidation of polysilicon 20, which results in oxide spacers 24. Oxidation is performed in an environment of oxygen at between about 900° and 1000° C. for between about 60 and 120 minutes.

The resultant spacers 24 have a thickness of between about 2500 and 3500 Angstroms. This spacer oxidation can result in a gradual junction profile at the edge of the channel, i.e., 0.05 to 0.1 micrometers deeper than the area of no oxidation. This creates a lightly doped drain (LDD) structure which provides better hot carrier performance. The dashed line in FIG. 3 shows the junction before polysilicon oxidation, and solid line shows the junction as it has moved during oxidation. The spacer thickness can be controlled by varying the process parameters, and lead to a channel length, i.e., the substrate area under protective block 18, less than lithographic limits, an important consideration for submicron device fabrication.

Nitride 22 offers an advantage over the prior art of U.S. Pat. No. 5,162,245 in that the thickness of polysilicon 20 is preserved during oxidation. This thickness is important to the polysilicon sheet resistance. The prior art technique, however, without the nitride layer, must trade off between the sheet resistance problem and the polysilicon thickness needed to produce the desired polysilicon oxide.

Figure 4:
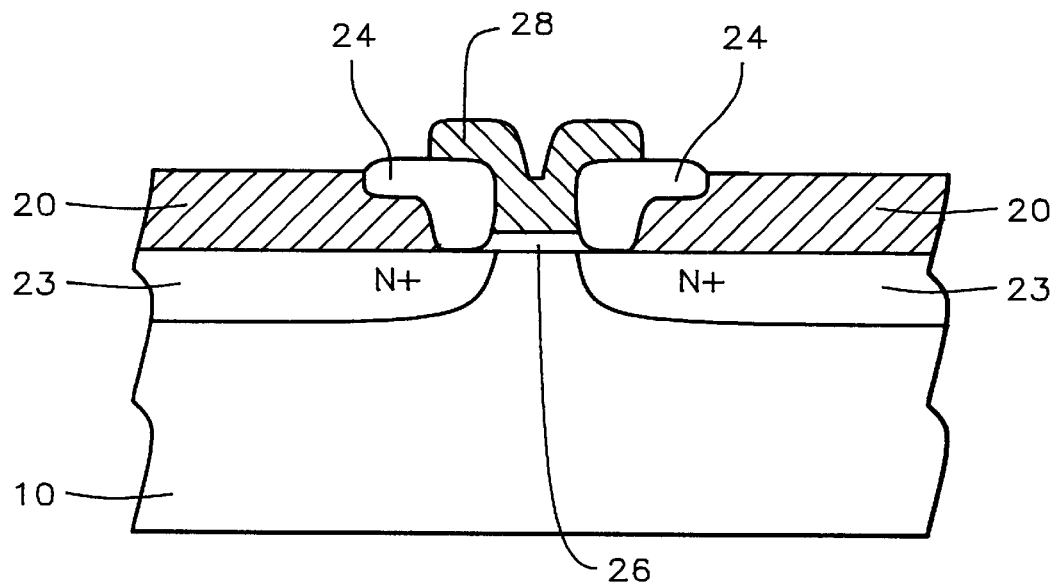

Referring now to FIG. 4, the remainder of the protective block, nitride 14 and oxide 12, are etched out and the gate structure of the MOSFET device is completed. Nitride 14 is removed by a wet etch using phosphoric acid at a temperature of between about 160° and 190° C. for between about 40 and 100 minutes. Thin pad oxide 12 is now removed by a wet etch, and a thin sacrificial oxide of between about 150 and 300 Angstroms thickness is grown in a dry oxygen ambient to remove any Kooi type defect in the channel region. This sacrificial oxide is then wet-etched in 50:1 solution of hydrofluoric acid, and the final gate oxide 26 is grown thermally at a temperature of between about 920° and 960° C. using trans-LC and oxygen ambient.

The gate electrode 28, as seen in FIG. 4, for the field effect transistor is now formed over the gate oxide 26 and delineation is made by conventional lithography and etching techniques. The gate electrode is formed of polysilicon and is deposited by low pressure chemical vapor deposition. The thickness of the gate electrode 28 is between about 3000 and 4000 Angstroms.

A higher level of metallurgy (not shown) is used to contact the source/drain regions using poly layer 20 and the gate electrode 26. Preferably this level of metallurgy is composed of aluminum or the like. Passivation and insulation between the metallurgy levels may be by sputtered or plasma deposited silicon dioxide or the like.

The gate area of the FET device in this invention is always protected by nitride and never exposed to either the polysilicon etch or reactive ion etch of oxide sidewalls of the prior art, thus preventing damage to the substrate in the critical channel region of the FET device.

Figure 5:
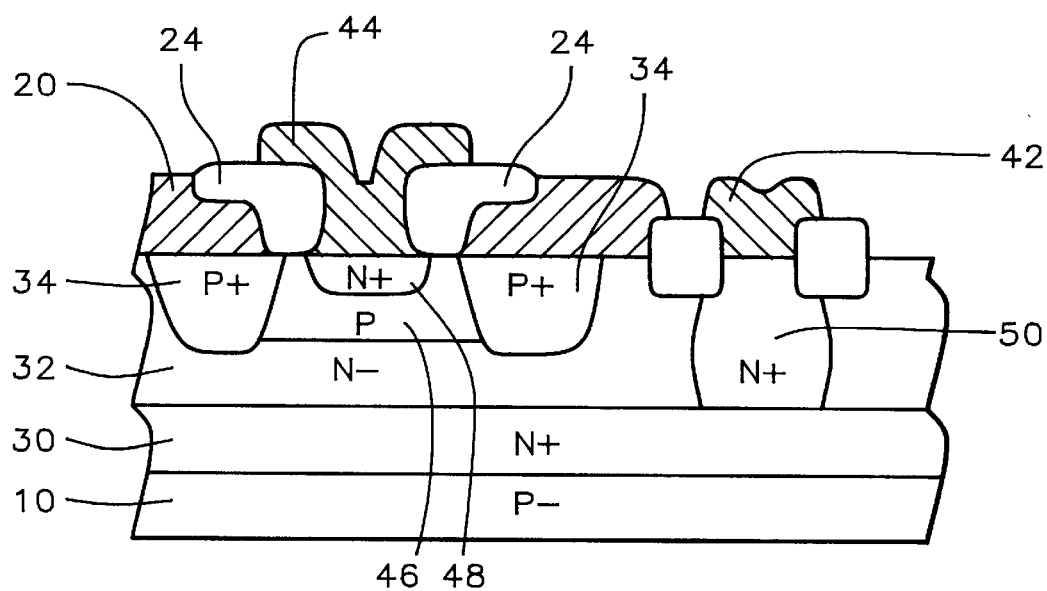
FIG. 5 is a cross-sectional representation of a resulting structure using essentially the first embodiment method for a bipolar transistor.

Referring now more particularly to FIG. 5, there is shown a resulting vertical NPN bipolar integrated circuit structure from a process that is a variation to that of the FIG. 1 through 4 embodiment. A vertical PNP bipolar structure could of course be fabricated by changing the conductivities of the regions involved in the process as is understood by those skilled in the art. This bipolar embodiment process proceeds in a similar fashion to that of the first embodiment and like numbers indicate like elements for both embodiments. However, one difference is the necessity of the N− subcollector 32 and the N+ epitaxial layer 30 upon the P− substrate which form the substrate 10 of the FIG. 5 embodiment. As is well known in the art, this epitaxial layer is formed over the entire P− substrate. An N− region is formed in the substrate where the bipolar devices are to be formed before the epitaxial layer growth and this N−subcollector region is formed during the epitaxial growth by outdiffusion.

Otherwise, the process of FIG. 1 through 4 remain substantially the same in formation of the NPN structure except that the doping for layer 20 is of an opposite conductivity (P+) to the first embodiment and forms the P+ regions 34 by a similar outdiffusion process to form the extrinsic base 34 of the bipolar transistor. Also, intrinsic base region 46 is formed by an ion implant of boron through the sacrificial oxide that was formed after etch of thin pad oxide 12. Collector contact 42 is formed at the same time as emitter contact 44 in the same manner as in the first embodiment for forming the gate electrode. Emitter contact 44 is ion implanted with arsenic (or BF$_2$ in the case of a PNP structure) and emitter region 48 is formed by a thermal cycle of about 900° C. for 30 minutes to drive out the As dopant and form the shallow junction.

A final difference from the FET method is that the gate oxide in the bipolar emitter region is removed by wet etch prior to formation of polysilicon emitter contact 44. As with the FIG. 1 through 4 embodiment, the resulting FIG. 5 embodiment requires a higher level of metallurgy (not shown) to contact the elements of the transistors, that is the emitter electrode 44, the base contact layer 20 and the collector electrode 42. This metallurgy level is preferably aluminum or the like. Passivation and insulation between the metallurgy levels are required in a similar way to that of the first embodiment.

Figure 7:
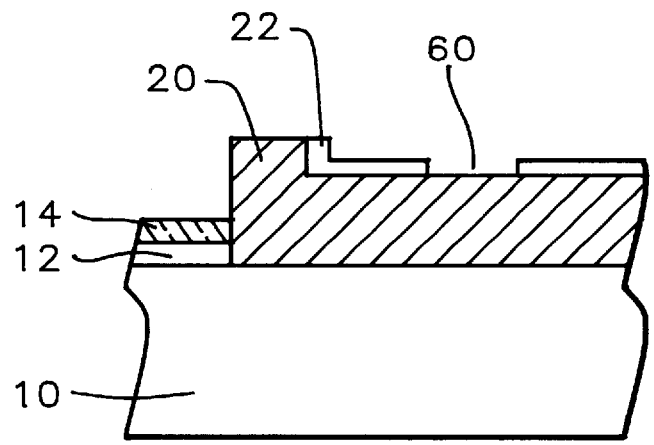
FIGS. 7 and 8 are a cross-sectional representation of a method for forming a field isolation region in conjunction with the improved self-aligned process of the invention.
Figure 8:
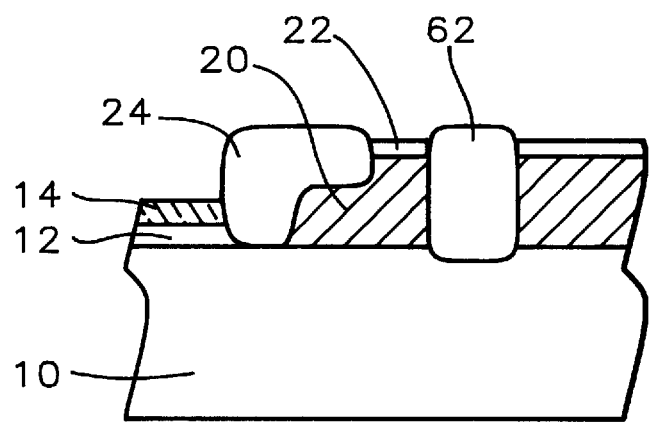

In either of the above embodiments, field isolation regions that separate the active transistor structures from each other may be formed in other than the conventional method. The conventional technique is the local oxidation of silicon, or LOCOS, and is usually performed prior to formation of the transistor regions. As shown in FIGS. 7 and 8, however, the field isolation regions may instead be formed by etching a part of silicon nitride layer 22 between the transistor regions to create opening 60, such that during oxidizing to form spacers 24, field isolation regions 62 are formed from oxidized polysilicon. This allows for the elimination of LOCOS processing steps.

Figure 6:
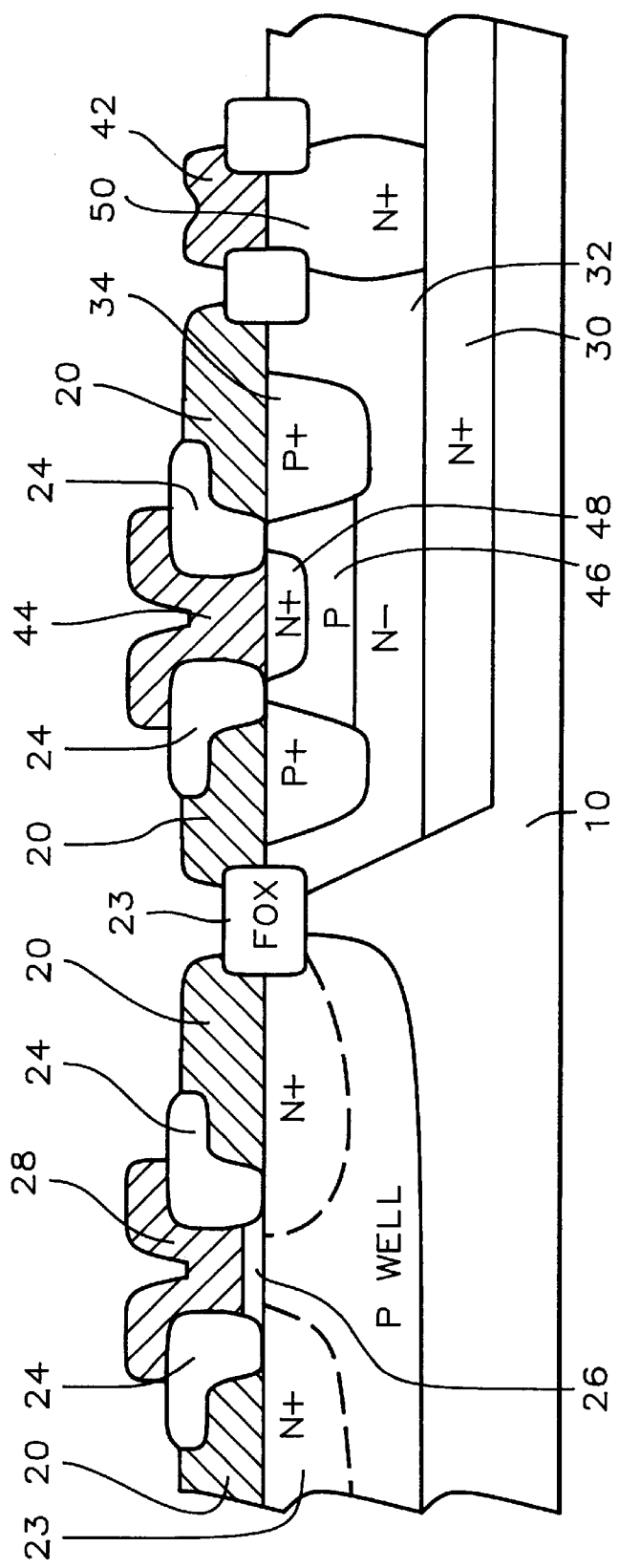
FIG. 6 is a cross-sectional representation of a resulting structure combining the embodiments of FIGS. 1 to 5 for a biCMOS structure.

The embodiments shown in FIGS. 1 to 4, and in FIG. 5, may also be combined as shown in FIG. 6, for a biCMOS application. Shown are an NMOS field effect transistor on the same substrate as an NPN bipolar device. Other combinations, e.g., a PMOS FET and a PNP bipolar device could be formed also, as is well understood in the art.

While the invention has been particularly shown and described with reference to the preferred embodiments thereof, it will be understood by those skilled in the art that various changes in form and detail may be made therein without departing from the spirit and scope of the invention.

What is claimed is:

1. A self-aligned transistor integrated circuit structure, comprising:

a silicon semiconductor substrate of a first conductivity type having field isolation regions that isolate semiconductor surface regions from one another;

heavily doped regions of one conductivity in at least some of said semiconductor surface regions which are of an opposite conductivity to said first conductivity type;

directly above said heavily doped regions are heavily doped conductive layers which are of the same conductivity, and are the source of the dopant in said heavily doped regions;

oxide spacers on an inner periphery of said heavily doped conductive layers and covering only one end of said heavily doped conductive layers, wherein each said end is adjacent to one of said oxide spacers, and wherein said oxide spacers cover all of the vertical surface of said ends and a portion of its horizontal top surface;

means for connecting remaining elements of said transistor; and electrical contact means to said elements to form said integrated circuit structure, wherein said electrical contact means for a center portion of said transistor comprises a contact with ends which are offset from said heavily doped conductive layers by a portion of said oxide spacers.

2. The structure of claim 1, wherein said transistor integrated circuit is a field effect transistor, said substrate is doped P−, said heavily doped regions are N+, said heavily doped conductive layers are N+ and formed of polysilicon, and further comprising a gate oxide on said substrate and between said oxide spacers.

3. The structure of claim wherein said transistor integrated circuit is a bipolar transistor, said substrate is doped N− in the region under said heavily doped regions, said heavily doped regions are P+, said heavily doped conductive layers are P+ and formed of polysilicon, and further comprising a heavily doped N+ emitter region in the surface of said substrate and between said oxide spacers, and further comprising an intrinsic base consisting of a lightly doped P region under said emitter region and connected to said heavily doped regions.

* * * * *